(12) United States Patent
Wu (10) Patent No.: US 11,957,027 B2
(45) Date of Patent: Apr. 9, 2024

(54) DISPLAY PANEL AND DISPLAY DEVICE

(71) Applicant: Xiamen Tianma Micro-Electronics Co.,Ltd., Xiamen (CN)

(72) Inventor: Yaodong Wu, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 486 days.

(21) Appl. No.: 17/346,850

(22) Filed: Jun. 14, 2021

(65) Prior Publication Data

US 2022/0302224 A1    Sep. 22, 2022

(30) Foreign Application Priority Data

Mar. 19, 2021 (CN) .......................... 202110305458.8

(51) Int. Cl.
  *H10K 59/60* (2023.01)
  *H10K 50/86* (2023.01)
  *H10K 59/38* (2023.01)
  *H10K 59/65* (2023.01)

(52) U.S. Cl.
  CPC .......... *H10K 59/60* (2023.02); *H10K 50/865* (2023.02); *H10K 59/65* (2023.02); *H10K 59/38* (2023.02)

(58) Field of Classification Search
  CPC ... H10K 50/865; H10K 59/65; H10K 59/8792
  See application file for complete search history.

(56) References Cited

U.S. PATENT DOCUMENTS

2019/0095674 A1* 3/2019 Ko .................... H01L 31/153

* cited by examiner

*Primary Examiner* — Daniel P Shook
(74) *Attorney, Agent, or Firm* — Anova Law Group, PLLC (57) ABSTRACT

A display panel and a display device are provided. The display panel includes a photosensitive array layer including a plurality of photosensitive units arranged in an array, a light-emitting function layer, and a color resist layer. The light-emitting function layer is disposed between the color resist layer and the photosensitive array layer. The color resist layer includes a first light-shielding layer and a plurality of first color resist units. The first light-shielding layer contains a plurality of first openings and a plurality of second openings. A first opening of the plurality of first openings corresponds to a photosensitive unit of the plurality of photosensitive units, and a first color resist unit of the plurality of first color resist units at least covers a second opening of the plurality of second openings. At least one of the plurality of second openings is connected with the first opening.

20 Claims, 9 Drawing Sheets

DISPLAY PANEL AND DISPLAY DEVICE

CROSS-REFERENCE TO RELATED APPLICATION

This application claims the priority of Chinese patent application No. 202110305458.8, filed on Mar. 19, 2021, the entirety of which is incorporated herein by reference.

FIELD

The present disclosure generally relates to the field of display technology and, more particularly, relates to a display panel and a display device.

BACKGROUND

With the use of more and more electronic products, a fingerprint lock is often used to protect information on an electronic product. Accordingly, a fingerprint identification device is also provided on a display screen of the electronic product for fingerprint unlocking. However, blurry imaging may occur under the screen of existing display screens, which result in low detection accuracy.

SUMMARY

One aspect of the present disclosure provides a display panel. The display panel includes a photosensitive array layer including a plurality of photosensitive units arranged in an array, a light-emitting function layer, and a color resist layer. The light-emitting function layer is disposed between the color resist layer and the photosensitive array layer. The color resist layer includes a first light-shielding layer and a plurality of first color resist units. The first light-shielding layer contains a plurality of first openings and a plurality of second openings. A first opening of the plurality of first openings corresponds to a photosensitive unit of the plurality of photosensitive units, and a first color resist unit of the plurality of first color resist units at least covers a second opening of the plurality of second openings. At least one of the plurality of second openings is connected with the first opening.

Another aspect of the present disclosure provides a display device. The display device includes a display panel. The display panel includes a photosensitive array layer including a plurality of photosensitive units arranged in an array, a light-emitting function layer, and a color resist layer. The light-emitting function layer is disposed between the color resist layer and the photosensitive array layer. The color resist layer includes a first light-shielding layer and a plurality of first color resist units. The first light-shielding layer contains a plurality of first openings and a plurality of second openings. A first opening of the plurality of first openings corresponds to a photosensitive unit of the plurality of photosensitive units, and a first color resist unit of the plurality of first color resist units at least covers a second opening of the plurality of second openings. At least part of the plurality of second openings is connected with the first opening.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

It should be noted that the relational terms such as "first" and "second" are merely used to distinguish one entity or operation from another entity or operation, and do not necessarily require or imply any such actual relationship or sequence between these entities or operations.

Moreover, the terms "include", "contain" or any variant may be intended to cover non-exclusive inclusion, such that a process, a method, an article, or a device that includes a series of elements may not only include such elements, but also include any other element that is not clearly listed, or may include elements inherent to such process, method, article or device. In a case without more restrictions, the element defined by the sentence "including . . . " may not exclude the existence of any other same element in the process, method, article, or device that includes the element.

It should be understood that when describing the structure of a component, when a layer or a region is referred to as being "on" or "above" another layer or another region, the layer or the region may be directly on the other layer or the other region, or other layers or regions may be contained between the layer or the region and the another layer or the another region. Further, when a component is turned over, the layer or the region may be "under" or "below" the another layer or the another region.

In addition, the term "and/or" may merely describe an association relationship of associated objects, which may include three kinds of relationships. For example, the term "A and/or B" may include three cases where A exists alone, A and B simultaneously exist, and B exists alone. In addition, the character "/" may often indicate that the associated objects before and after the character are in an "or" relationship.

It should be understood that in the disclosed embodiments, "B corresponding to A" may mean that B is associated with A, and B may be determined according to A. However, it should also be understood that B may be determined not only based on A, but also based on A and/or other information.

Figure 1:
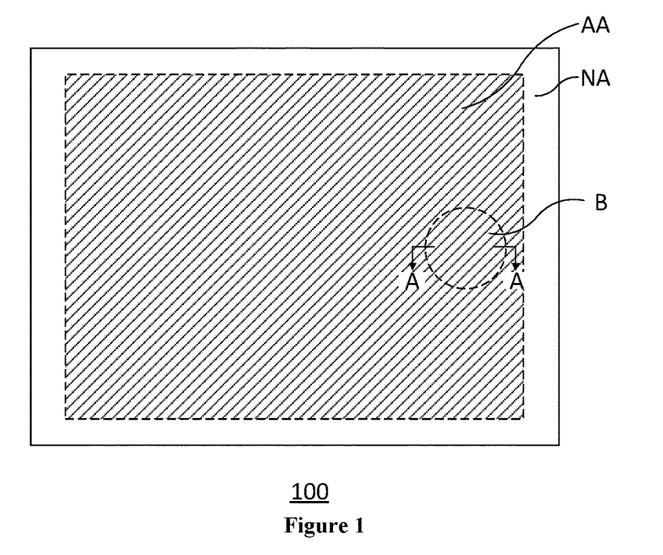
FIG. 1 illustrates a schematic diagram of a display panel.
Figure 2:
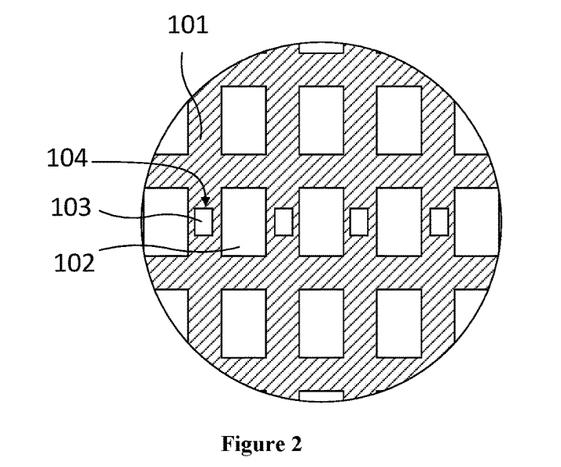
FIG. 2 illustrates a local zoom-in view of a region B of a display panel in FIG. 1.
Figure 3:
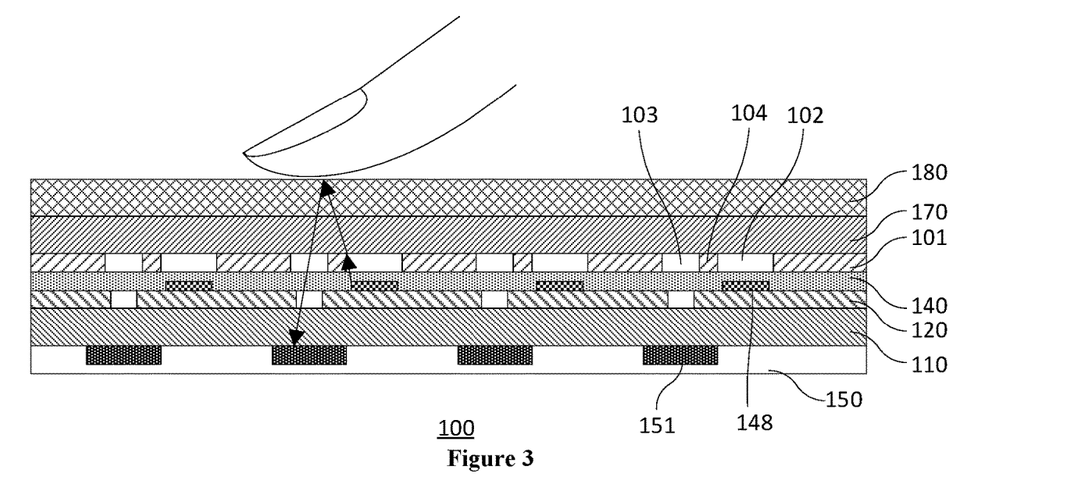
FIG. 3 illustrates a schematic AA-sectional view of a display panel in FIG. 1.

FIG. 1 illustrates a schematic diagram of a display panel; FIG. 2 illustrates a local zoom-in view of a region B of the display panel in FIG. 1; and FIG. 3 illustrates a schematic AA-sectional view of the display panel in FIG. 1.

When performing under-screen imaging, a display panel 100 has a problem of poor imaging clarity. The reason may include following. In a display region AA, an imaging opening 103 is spaced apart from light-shielding layer openings 102 arranged in an array on a light-shielding layer 101 (e.g., a black matrix layer (BM)) by a frame 104. Because the frame 104 is a portion of the light-shielding layer 101, the frame 104 is opaque. When light passes through the light-shielding layer opening 102 and the imaging opening 103, the opaque frame 104 may cause diffraction of light, thereby reducing the sharpness of imaging.

When the display panel 100 performs imaging, the display panel 100 may perform imaging through the light emitted by a light-emitting device 148 of a light-emitting function layer 140. The light emitted by the light-emitting device first passes through the light-shielding layer opening 102, and irradiates on the object under test (e.g., a finger) outside a cover plate 180 of the display panel 100. The light is reflected by the object under test, passes through the imaging opening 103, and irradiates on a photosensitive array layer 150 of the display panel 100 for imaging. The light-shielding layer openings 102 are openings in an array, and the light-shielding layer 101 may form an opaque layer mesh. The imaging opening 103 may not overlap the light-shielding layer opening 102, such that the opaque frame 104 is disposed between the light-shielding layer opening 102 and the imaging opening 103. Due to the small width of the frame 104, when passing through the light-shielding layer opening 102 and the imaging opening 103, light may be diffracted due to the occlusion of the frame 104. The light near the frame 104 may be bent and may be irradiated on the inside region shielded by the frame 104, such that the light is more divergent, and ultimately the sharpness of imaging is reduced.

Figure 4:
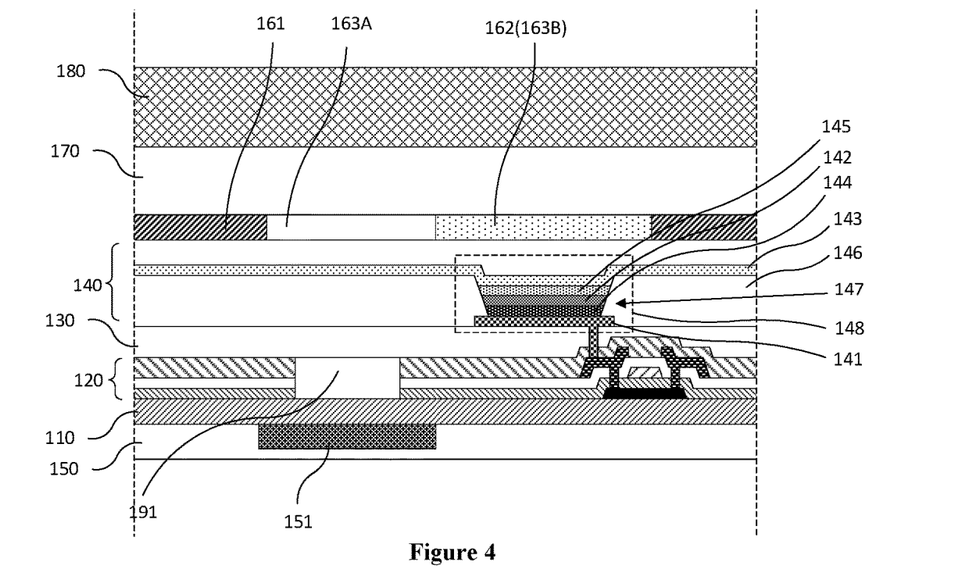
FIG. 4 illustrates a schematic AA-sectional view of an exemplary display panel in FIG. 1 consistent with disclosed embodiments of the present disclosure.

The present disclosure provides a display panel. Referring to FIG. 1, the display panel 100 may be divided into a display region AA and a non-display region NA. FIG. 4 illustrates a schematic AA-sectional view of the display panel in FIG. 1 consistent with disclosed embodiments of the present disclosure. Referring to FIG. 1 and FIG. 4, the display panel may include a substrate 110, an array layer 120, a light-emitting function layer 140 and an encapsulation layer 170. The array layer 120 may be disposed over the substrate 110. The light-emitting function layer 140 may be disposed on a side of the array layer 120 away from the substrate 110. The encapsulation layer 170 may be disposed on a side of the light-emitting function layer 140 away from the array layer 120. The light-emitting function layer 140 may include a light-emitting device 148, and the light-emitting device 148 may be disposed in the display region AA.

In one embodiment, the substrate 110 may be made of glass, polyimide (PI), polycarbonate (PC), polyethersulfone (PES), polyethylene terephthalate (PET), polyethylene naphthalate (PEN), polyarylate (PAR), glass fiber reinforced plastic (FRP), or any other polymer material. The substrate 110 may be transparent, translucent, or opaque. The substrate 110 in the present disclosure may also be a flexible substrate made of a substantially thin polymer, e.g., polyimide. The substrate may also include a buffer layer. The buffer layer may include a laminated structure composed of multiple inorganic and organic layers, to block oxygen and moisture and to prevent moisture or impurities from being diffused into the display panel through the substrate. Further, the buffer layer may provide a flat surface on an upper surface of the substrate, which may not be described in details.

In one embodiment, the array layer 120 may include a plurality of thin film transistors (TFT), and a pixel circuit composed of thin film transistors for controlling the light-emitting device 148. For illustrative purposes, top-gate thin film transistors may be used as an example for description. The array layer 120 may include an active layer for forming the thin film transistor. The active layer may include a source region and a drain region formed by doping N-type impurity ions or P-type impurity ions, and a channel region disposed between the source region and the drain region. The array layer 120 may also include a gate insulating layer disposed over the active layer, and a gate of the thin film transistor disposed on the gate insulating layer. Moreover, the array layer 120 may include an interlayer insulating layer disposed on the gate. The interlayer insulating layer may be made of an insulating inorganic layer such as silicon oxide or silicon nitride. In another embodiment, the interlayer insulating layer may be made of an insulating organic layer. A source electrode and a drain electrode of the thin film transistor may be disposed over the interlayer insulating layer. The source electrode and the drain electrode may be electrically connected (or coupled) to the source region and the drain region through contact holes, respectively. The contact hole may be formed by selectively removing the gate insulating layer and the interlayer insulating layer.

Optionally, the array layer 120 may further include a passivation layer (not illustrated in the Figure) disposed over the thin film transistor. In one embodiment, the passivation layer may be disposed over the source electrode and the drain electrode. The passivation layer may be made of an inorganic layer such as silicon oxide or silicon nitride, or may be made of an organic layer.

Optionally, the display panel 100 may further include a planarization layer 130 disposed on the array layer 120. The planarization layer 130 may include an organic layer such as acrylic, polyimide (PI) or benzocyclobutene (BCB), etc. The planarization layer 130 may planarize a surface of the array layer.

In one embodiment, the light-emitting device 148 may be an organic light-emitting diode (OLED). For illustrative purposes, an OLED light-emitting device may be used as an example for description in the following. In another embodiment, the light-emitting device 148 may be an inorganic light-emitting diode (LED).

In one embodiment, the light-emitting function layer 140 may be disposed on the planarization layer 130. For illustrative purposes, the light-emitting device 148 as an OLED may be used as an example. The light-emitting device 148 may include an anode 141, a pixel definition layer 146 covering the anode 141, an organic light-emitting layer 142, and a cathode 143. The anode 141, the organic light-emitting layer 142, and the cathode 143 may be sequentially arranged along a direction facing away from the substrate 110. The anode 141 may include anode patterns that one-to-one correspond to pixel units. An anode pattern may be electrically connected to one of the source electrode and the drain electrode of the thin film transistor through a via in the planarization layer 130. The pixel definition layer 146 may be disposed on a side of the anode 141 away from the array layer 120. The pixel definition layer 146 may be made of an organic material such as polyimide (PI), polyamide, benzocyclobutene (BCB), acrylic resin, phenol resin, etc., or an inorganic material such as $SiN_x$.

The pixel definition layer 146 may include a plurality of pixel definition openings 147, and the pixel definition openings 147 may expose the anode 141. The pixel definition layer 146 may cover edges of the anode patterns. The organic light-emitting layer 142 may at least be partially filled in the pixel definition opening 147 and may be in contact with the anode 141. The organic light-emitting layer 142 in the pixel definition opening 147 may form a smallest light-emitting device 148. Each light-emitting device 148 may emit light of different color according to different organic light-emitting layer 142. Each light-emitting device 148 and the pixel circuit may together constitute a sub-pixel. A plurality of sub-pixels may form a pixel unit, and a plurality of pixel units may display the screen.

Optionally, the organic light-emitting layer 142 may be formed in the pixel definition openings 147 of the pixel definition layer 146 using inkjet printing, nozzle printing, or evaporation. The cathode 143 may be formed on the organic light-emitting layer 142 by evaporation. Optionally, the cathode 143 may fully cover the organic light-emitting layer 142 and the pixel definition layer 146 as an entire surface.

Optionally, in one embodiment, the light-emitting function layer 140 may further include a hole-transport layer 144 and an electron-transport layer 145. The hole-transport layer 144 may be disposed on a surface of the anode 141 facing away from the substrate 110, the organic light-emitting layer 142 may be disposed on a surface of the hole-transport layer 144 facing away from the anode 141, and the electron-transport layer 145 may be disposed on a surface of the organic light-emitting layer 142 facing away from the hole-transport layer 144. The hole-transport layer 144 may be disposed between the anode 141 and the organic light-emitting layer 142, to enhance the ability of holes of the anode 141 being injected and transported to the organic light-emitting layer 142. The electron-transport layer 145 may be disposed between the organic light-emitting layer 142 and the cathode 143, to enhance the ability of electrons of the cathode 143 being injected and transported to the organic light-emitting layer 142. In view of this, more holes and electrons may be injected into the organic light-emitting layer 142, thereby increasing the recombination efficiency, and improving the light-emitting efficiency of the organic light-emitting layer 142.

Optionally, the display panel 100 may further include a hole-injection layer and an electron-injection layer (not illustrated in the Figure). The hole-injection layer may be disposed on a surface of the hole-transport layer 144 facing away from the organic light-emitting layer 142, i.e., between the anode 141 and the hole-transport layer 144. The electron-injection layer may be disposed on a surface of the electron transport layer 145 facing away from the organic light-emitting layer 142, i.e., between the cathode 143 and the electron-transport layer 145.

In one embodiment, the encapsulation layer 170 may be a thin-film encapsulation layer, and the thin-film encapsulation layer may be disposed on a side of the light-emitting function layer 140 facing away from the array layer 120. The thin-film encapsulation layer may encapsulate a display layer, i.e., the light-emitting function layer. In other words, the peripheral edge of the thin-film encapsulation layer may be in contact with the array layer 120 to seal the light-emitting component. Optionally, the thin-film encapsulation layer may fully cover the entire display region AA, may be extended to the non-display region NA from the display region AA, and may be in contact with the array layer 120 in the non-display region NA.

In one embodiment, the display panel 100 may further include a cover plate 180. The cover plate 180 may be disposed on a side of the encapsulation layer 170 facing away from the substrate 110, to protect the display panel 100. In one embodiment, when the object under test is close to the cover plate 180, the object under test may be imaged under the screen.

Optionally, the display panel 100 may further include a touch-control panel. The touch-control panel may be disposed on a side of the cover plate 180 facing away from the light-emitting function layer 140 and may be configured to implement the touch-control function. The touch-control panel may adopt an existing touch-control panel structure, which may not be described in detail.

Figure 5:
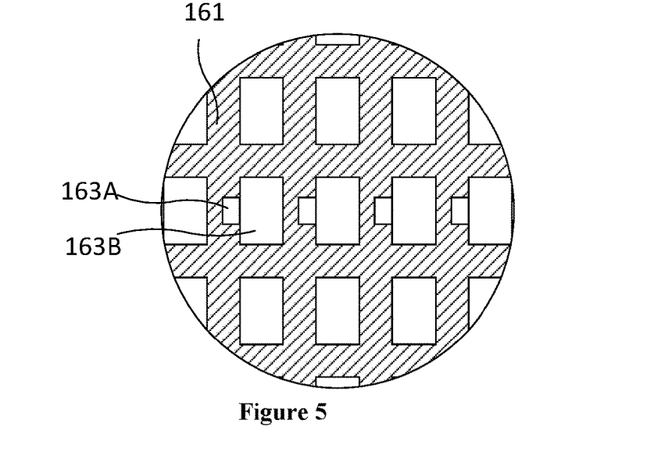
FIG. 5 illustrates a schematic local zoom-in view of a first shielding layer of a region B of an exemplary display panel in FIG. 1 consistent with disclosed embodiments of the present disclosure.
Figure 6:
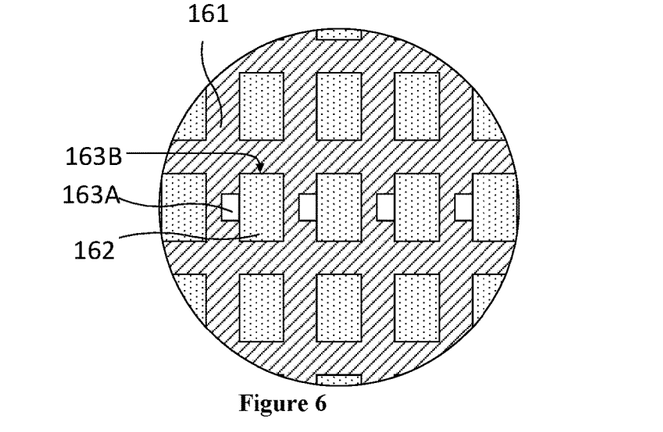
FIG. 6 illustrates a schematic local zoom-in view of a color resist layer of a region B of an exemplary display panel in FIG. 1 consistent with disclosed embodiments of the present disclosure.
Figure 7:
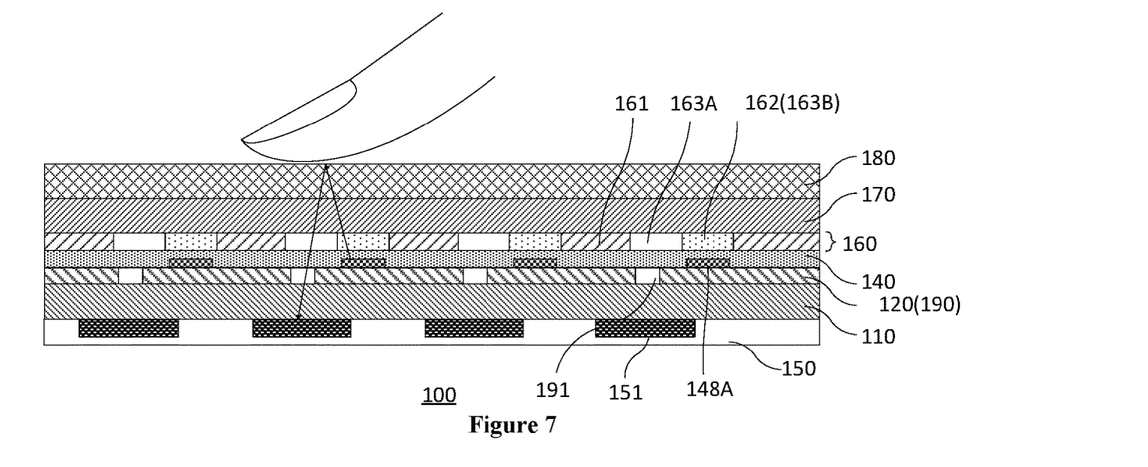
FIG. 7 illustrates a schematic AA-sectional view of another exemplary display panel in FIG. 1 consistent with disclosed embodiments of the present disclosure.

FIG. 5 illustrates a schematic local zoom-in view of a first shielding layer of a region B of a display panel in FIG. 1; FIG. 6 illustrates a schematic local zoom-in view of a color resist layer of a region B of a display panel in FIG. 1; and FIG. 7 illustrates a schematic AA-sectional view of a display panel in FIG. 1. The specific structures of the light-emitting function layer 140 and the array layer 120 may refer to FIG. 4, and may not be illustrated in FIG. 7.

Referring to FIG. 1 and FIGS. 5-7, the display panel 100 may further include a photosensitive array layer 150 and a color resist layer 160. The photosensitive array layer 150 may be disposed on a side of the substrate 110 facing away from the light-emitting function layer 140. The photosensitive array layer 150 may include a plurality of photosensitive units 151 in an array for receiving light and imaging. Optionally, in one embodiment, for illustrative purposes, the light required for imaging by the photosensitive array layer 150 may be provided by the light-emitting function layer 140. In another embodiment, an additional light source may be provided to provide light to make the photosensitive array layer 150 image the object under test. Specifically, the light-emitting function layer 140 may emit light, and after being reflected by the object under test close to the surface of the cover plate 180, the light may be irradiated on the photosensitive array layer 150 and may be imaged on the photosensitive array layer 150 to obtain an image of the object under test.

The color resist layer 160 may be disposed between the cover plate 180 and the light-emitting function layer 140, to prevent crosstalk between light of different colors. In one embodiment, the color resist layer 160 may include a first light-shielding layer 161 and a first color resist unit 162. The first light-shielding layer 161 may contain first openings 163A and second openings 163B. A first opening 163A may correspond to a photosensitive unit 151, and a first color resist unit 162 may at least cover a second opening 163B. It should be noted that in a case where the first opening 163A corresponds to the photosensitive unit 151, an orthographic projection of the first opening 163A on a plane of the display panel 100 may overlap an orthographic projection of the photosensitive unit 151 on the plane of the display panel 100.

Referring to FIG. 7, the light emitted by the light-emitting function layer 140 may be blocked by the first light-shielding layer 161, and may emit through the second opening 163B. After being reflected by the object under test, the emitted light may be blocked by the first light-shielding layer 161 again, and then may irradiated on the photosensitive array layer 150 through the first opening 163A, to achieve photosensitive imaging. All the light emitted by the light-emitting device of the light-emitting function layer 140 may be irradiated on the photosensitive array layer 150 at a small incident angle after being reflected by the object under test.

If the stray light is the external light of the display panel, the uncertainty of the incident angle of the light may tend to cause blurry imaging. If the stray light is light of any other color emitted by any other light-emitting device in the display panel, because the any other light-emitting device has a distance from the first opening 163A greater than the light-emitting device corresponding to the first opening 163A, the light of any other color may be irradiated on the photosensitive array layer 150 at a substantially large incident angle, which may increase the imaging region, and may affect the accuracy of imaging of the object under test according to the optical path.

Because the first color resist unit 162 covers the second opening 163B, the light emitted from the second opening 163B may have a same color as the color resist of the first color resist unit 162. The photosensitive array layer 150 may perform imaging with the light of the corresponding color. The first color resist unit 162 may filter stray light, which may avoid interference of any other stray light on imaging clarity.

It should be noted that the solid line between the first opening 163A and the second opening 163B may merely indicate the boundary therebetween, and may not indicate that the first light-shielding layer 161 is present.

Referring to FIG. 6, at least a part of the second openings 163B may be connected with the first opening 163A, such that the first opening 163A and the second opening 163B may form a combined opening. By connecting the first opening 163A with the second opening 163B, the frame of the first light-shielding layer 161 between the first opening 163A and the second opening 163B may be reduced, thereby reducing the refraction of light caused by the frame of the light-shielding layer between the first opening 163A and the second opening 163B, and improving the sharpness of imaging of the photosensitive array layer 150.

Referring to FIG. 7, the display panel 100 may further include a second light-shielding layer 190. The second light-shielding layer 190 may include an imaging pinhole 191, and the imaging pinhole 191 may correspond to the first opening 163A. In other words, an orthographic projection of the imaging pinhole 191 on the plane of the display panel 100 may overlap the orthographic projection of the first opening 163A on the plane of the display panel 100. The display panel 100 may adopt a pinhole imaging form to enable the photosensitive array layer 150 to obtain a clear and substantially large image. After being reflected by the object under test, the light may pass through the imaging pinhole 191 of the second light-shielding layer 190, and may perform pinhole imaging on the photosensitive array layer 150. It should be noted that, under the premise of without affecting the imaging effect, any other suitable imaging method may be used in the present disclosure. For illustrative purposes, a lens imaging or a direct imaging may be used.

It should be noted that the second light-shielding layer 190 may be a metal layer. In certain embodiments, the second light-shielding layer 190 may be multiplexed as a part of film layers of the light-emitting function layer 140. For illustrative purposes, the array layer 120 may include multiple metal layers, and at least one of the multiple metal layers may be multiplexed as the second light-shielding layer 190. The region covered by the projection of the imaging pinhole 191 on the other metal layers may be transparent, to ensure that light is capable of smoothly passing through the array layer and performing pinhole imaging on the photosensitive array layer 150 through the imaging pinhole 191. When a combined film layer composed of the multiple metal layers is multiplexed as the second light-shielding layer 190, the orthographic projections of opaque regions of the multiple metal layers on the plane of the display panel 100 may form a pattern, which may not overlap the orthographic projection of imaging pinhole 191 on the plane of the display panel 100.

Referring to FIG. 7, the orthographic projection of the imaging pinhole 191 on the plane of the display panel 100 may have an area smaller than the orthographic projection of the first opening 163A on the plane of the display panel 100, such that the first opening 163A at the incident side of the light may be greater than the imaging pinhole 191. The light passing through the first opening 163A may perform photosensitive imaging on the photosensitive array layer 150 in the form of pinhole imaging through the imaging pinhole 191. The imaging pinhole 191 may correspond to the first opening 163A, in other words, the orthographic projection of the imaging pinhole 191 on the plane of the display panel 100 may overlap the orthographic projection of the first opening 163A on the plane of the display panel 100, such that the light reflected by the object under test may be capable of smoothly passing through the first opening 163A and the imaging pinhole 191, and may perform photosensitive imaging on the photosensitive array layer 150 in the form of pinhole imaging.

Referring to FIG. 7, the light-emitting function layer 140 may include a first light-emitting device 148A. The first light-emitting device 148A may emit light, and the light may pass through the first color resist unit 162 and may be irradiated on the object under test. After being reflected by the object under test, the light may pass through the first opening 163A, may be irradiated on the photosensitive array layer 150, and may be imaged on the photosensitive array layer 150. To increase the intensity of light passing through the first color resist unit 162, the light-emitting color of the first light-emitting device 148A may be the same as the color of color resist of the first color resist unit 162, such that more light may pass through the first color resist unit 162 for imaging, and may ultimately increase the brightness of the image.

The first light-emitting device 148A may correspond to the first color resist unit 162. In other words, an orthographic projection of the first light-emitting device 148A on the plane of the display panel 100 may overlap an orthographic projection of the first color resist unit 162 on the plane of the display panel 100. Therefore, the light emitted by the first light-emitting device 148A may pass through the first color resist unit 162 at a substantially small incident angle. After being reflected by the object under test, the light may be smoothly irradiated on the photosensitive array layer 150 for imaging. Thus, the light may be prevented from being scattered or totally reflected, which may avoid affecting the clarity and brightness of the imaging.

Figure 8:
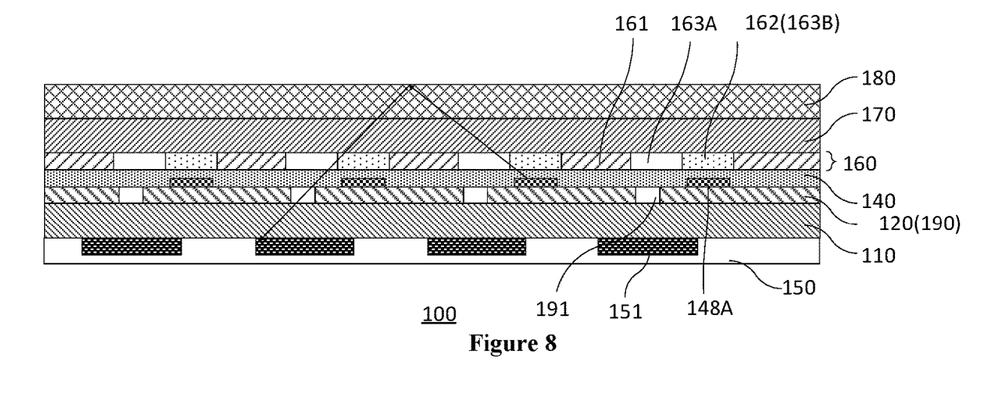
FIG. 8 illustrates a schematic AA-sectional view of another exemplary display panel in FIG. 1 consistent with disclosed embodiments of the present disclosure.

FIG. 8 illustrates a schematic AA-sectional view of another display panel in FIG. 1. The specific structures of the light-emitting function layer 140 and the array layer 120 may refer to FIG. 4, and may not be illustrated in FIG. 8. Referring to FIG. 7, considering that there may be multiple first light-emitting devices 148A, for a certain first light-emitting device 148A, when performing imaging, because the first light-emitting device 148A corresponds to the second opening 163B, and the first opening 163A is connected with the second opening 163B, the light emitted by the first light-emitting device 148A may be irradiated on the cover plate 180 with a substantially small incident angle. Thus, the light may pass through the cover plate 180 and may be irradiated on the object under test. After being reflected by the object under test, the light may be imaged.

Referring to FIG. 8, because the sub-pixels (equivalent to light-emitting devices) of different colors are arranged adjacently, pixels of the same color may be spaced apart by a pixel of any other color. Compared with the first light-emitting device 148A, any other first light-emitting device 148A may have a greater distance from the first opening 163A corresponding to the first light-emitting device 148A. Therefore, in a case without finger press, a portion of the light emitted by any other first light-emitting device 148A may be irradiated on the cover plate 180 with a substantially large incident angle. Because the incident angle of the light is substantially large, the light may be totally reflected at the interface between the cover plate 180 and the outside. After being totally reflected, the light emitted by any other first light-emitting device 148A may pass through the first opening 163A corresponding to the first light-emitting device 148A, and may be imaged on the photosensitive array layer 150. In view of this, the imaging object may be the any other first light-emitting device 148A, in other words, the light-emitting device may be imaged. The imaging of the light-emitting device may be configured to determine whether the any other first light-emitting device 148A is in a normal operating state in real time, and may be configured to adjust control parameters of the any other first light-emitting device 148A to improve the light-emitting uniformity of the light-emitting function layer 140.

In one embodiment, to avoid interference between the imaging of the light-emitting device and the imaging of the object under test, when the object under test is close to the cover plate 180 (e.g., when a finger presses the display panel for fingerprint recognition), the object under test may be imaged. When there is no object under test near the cover plate 180 (e.g., when a finger does not press the display panel), the light-emitting device may be imaged.

It should be noted that, in one embodiment, the light-emitting function layer 140 may also be used for the display of the display panel 100. Therefore, the first light-shielding layer 161 may be a black matrix layer of the display panel 100, to simplify the structure of the display panel 100.

Figure 9:
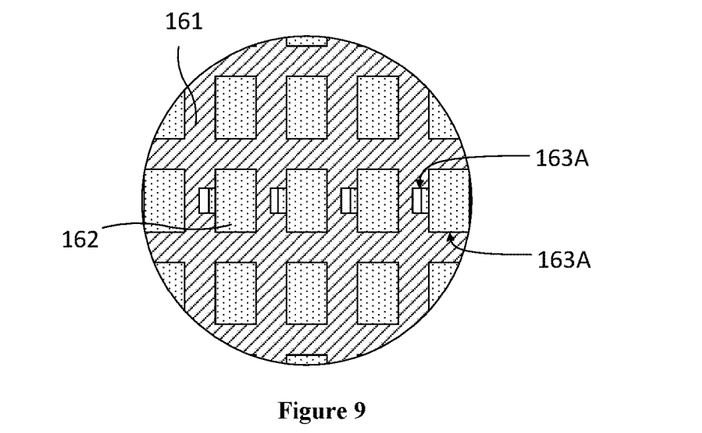
FIG. 9 illustrates a schematic local zoom-in view of a color resist layer of a region B of another exemplary display panel in FIG. 1 consistent with disclosed embodiments of the present disclosure.

FIG. 9 illustrates a schematic local zoom-in view of a color resist layer of a region B of the display panel in FIG. 1. Referring to FIG. 5 and FIG. 9, in addition to covering the second opening 163B, the first color resist unit 162 may further cover at least a portion of the first opening 163A. Therefore, when the light reflected by the object under test passes through the first opening 163A, the reflected light may need to at least partially pass through the first color resist unit 162. For a certain first opening 163A, the first opening 163A may correspond to a certain pixel unit. The certain pixel unit may include a plurality of sub-pixels of different colors, and the sub-pixels of different colors may correspond to light-emitting devices of different colors, respectively. One of the light-emitting devices of different colors may be the first light-emitting device 148A corresponding to the first opening 163A. Because the light-emitting device of any other color also has a substantially small distance from the first opening 163A, the light of any other color emitted by the light-emitting device of any other color may be irradiated on the cover plate 180 with a substantially small incident angle. After being reflected by the object under test, the light of any other color may pass through the first opening 163A and be irradiated on the photosensitive array layer 150, which may cause blurry imaging.

Because the first color resist unit 162 covers at least a portion of the first opening 163A, the light of any other color may be prevented from passing through the first opening 163A. Therefore, through configuring the first color resist unit 162 to cover a portion of the first opening 163A, any other stray light that is capable of passing through the first opening 163A may be reduced, such that the light irradiated on the photosensitive array layer 150 may substantially truly reflect the object under test. It should be noted that the stray light may refer to the outside light or light emitted by the display panel 100 that has a color different from the color resist of the first color resist unit 162. In certain embodiments, the first color resist unit 162 may fully cover the first opening 163A and the second opening 163B.

Referring to FIG. 5, the first opening 163A may be directly connected to the second opening 163B. The first opening 163A and the second opening 163B may form a combined opening, and the orthographic projection of the first opening 163A on the plane of the display panel 100 may overlap the orthographic projection of the second opening 163B on the plane of the display panel 100. In view of this, an edge of the first opening 163A and an edge of the second opening 163B may be merged to form an edge of the combined opening. When the edge of the combined opening has an obvious sharp point, e.g., a sharp corner or a bend, the light may tend to be diffracted when passing through the sharp point, which may affect the clarity of the imaging.

In one embodiment, the angle between the extension directions of edges on both sides of any point on the edge of the combined opening may be greater than or equal to 90°, such that the edge of the combined opening may not have the obvious sharp point, thereby ensuring that the photosensitive array layer 150 is capable of presenting a clear image. It should be noted that the edge of the combined opening may be one or more of a straight line segment and a curved line segment. When the adjacent two edges of the combined opening are straight line segments, the angle between the two edges may be greater than or equal to 90°. When one of the adjacent two edges of the combined opening is a straight line segment and the other is a curved line segment, at the junction of the two edges, the angle between the tangent of the curved line segment and the straight line segment may be greater than or equal to 90°. When the adjacent two edges of the combined opening are curved line segments, at the junction of the two edges, the angle between the tangents of the two curved line segments may be greater than or equal to 90°.

Figure 10:
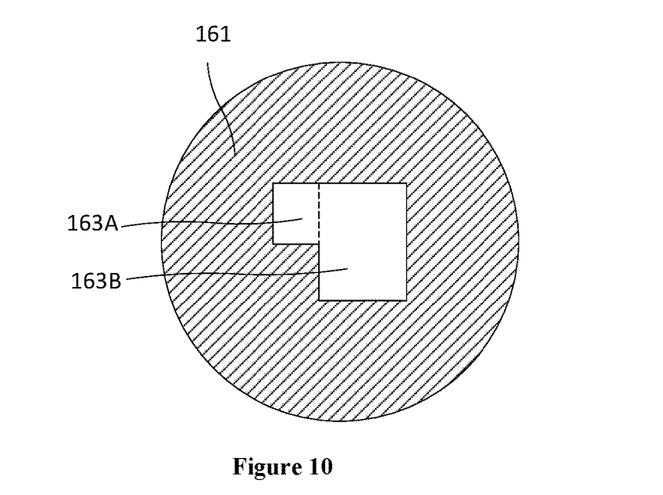
FIG. 10 illustrates a schematic local zoom-in view of a first shielding layer of a region B of another exemplary display panel in FIG. 1 consistent with disclosed embodiments of the present disclosure.
Figure 11:
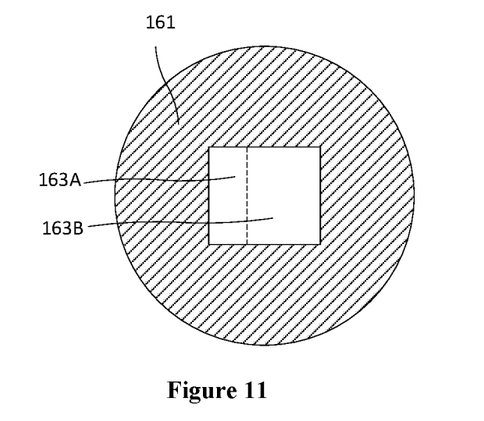
FIG. 11 illustrates a schematic local zoom-in view of a first shielding layer of a region B of another exemplary display panel in FIG. 1 consistent with disclosed embodiments of the present disclosure.
Figure 12:
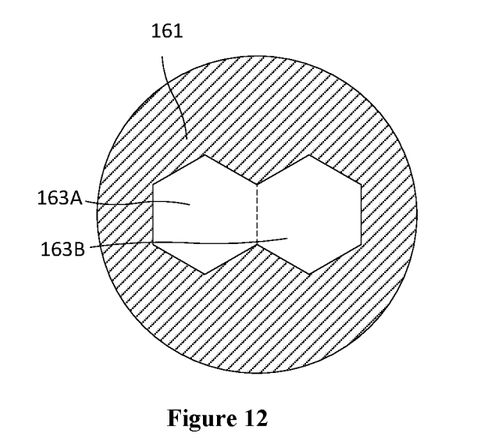
FIG. 12 illustrates a schematic local zoom-in view of a first shielding layer of a region B of another exemplary display panel in FIG. 1 consistent with disclosed embodiments of the present disclosure.

FIG. 10 illustrates a schematic local zoom-in view of a first shielding layer of a region B of another display panel in FIG. 1; FIG. 11 illustrates a schematic local zoom-in view of a first shielding layer of a region B of another display panel in FIG. 1; and FIG. 12 illustrates a schematic local zoom-in view of a first shielding layer of a region B of another display panel in FIG. 1. One set of first opening and second opening may be illustrated in FIGS. 10-12. In the present disclosure, multiple sets of first opening and second opening may be provided.

Referring to FIG. 5 and FIGS. 10-12, both the first opening 163A and the second opening 163B may be a polygonal opening, which may facilitate the array arrangement of the first opening 163A and the second opening 163B on the first light-shielding layer 161. At least a portion of at least one edge of the first opening 163A may be connected with at least a portion of at least one edge of the second opening 163B. For illustrative purposes, referring to FIG. 5 and FIGS. 10-11, when both the first opening 163A and the second opening 163B have a rectangular shape, the edge of the first opening 163A may be connected to the edge of the second opening 163B, and the combined opening may have a "L-character" shape, a "T-character" shape, or a rectangular shape. The angle between any two adjacent edges may be 90°, and obvious diffraction phenomenon may not occur at the vertex of the edge, such that the photosensitive array layer 150 may obtain a clear image.

Referring to FIG. 12, when both the first opening 163A and the second opening 163B have a regular hexagon shape, the edge of the first opening 163A may be connected to the second opening 163B, and the angle between any two adjacent edges may be 120°. In the present disclosure, the shapes of the first opening 163A and the second opening 163B may not be limited to the rectangle shape and the regular hexagonal shape, and the first opening 163A and the second opening 163B may have any other polygonal shape. When the first opening 163A is directly connected with the second opening 163B, an opening area of the first opening 163A may be smaller than or equal to an opening area of the second opening 163B, which may facilitate converging and imaging of light. In view of this, one edge of the first opening 163A may be connected with a portion of one edge of the second opening 163B, such that the first opening 163A may be disposed at the top corner or at the edge of the second opening 163B. For illustrative purposes, both the first opening 163A and the second opening 163B may have a square shape as an example. Referring to FIG. 10, the first opening 163A may be disposed at the top corner of the second opening 163B, such that the combined opening formed by the first opening 163A and the second opening 163B may have a "L-character" shape. Alternatively, referring to FIG. 5, the first opening 163A may be disposed at the edge of the second opening 163B, such that the combined opening formed by the first opening 163A and the second opening 163B may have a "T-character" shape, which may not be limited by the present disclosure.

Figure 13:
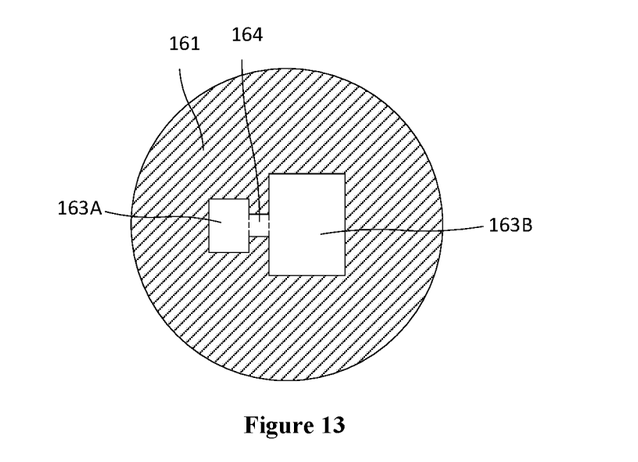
FIG. 13 illustrates a schematic local zoom-in view of a first shielding layer of a region B of another exemplary display panel in FIG. 1 consistent with disclosed embodiments of the present disclosure.
Figure 14:
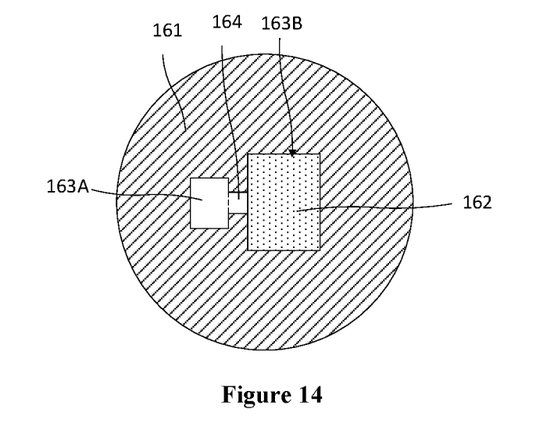
FIG. 14 illustrates a schematic local zoom-in view of a color resist layer of a region B of another exemplary display panel in FIG. 1 consistent with disclosed embodiments of the present disclosure.

FIG. 13 illustrates a schematic local zoom-in view of a first shielding layer of a region B of another display panel in FIG. 1; and FIG. 14 illustrates a schematic local zoom-in view of a color resist layer of a region B of another display panel in FIG. 1. One set of the first opening, the second opening, and a first connection channel 164 may be illustrated in FIGS. 13-14. In the present disclosure, multiple sets of the first opening, the second opening, and the first connection channel 164 may be provided.

Referring to FIGS. 13-14, the first opening 163A may be indirectly connected with the second opening 163B. The first opening 163A may be connected with the second opening 163B through at least one first connection channel 164. In view of this, the orthographic projection of the first opening 163A on the photosensitive array layer 150 may be disposed outside the orthographic projection of the second opening 163B on the photosensitive array layer 150, such that the first opening 163A and the second opening 163B may be independent openings on the first light-shielding layer 161. The first opening 163A may be connected to the second opening 163B through the first connection channel 164, such that the first opening 163A, the second opening 163B, and the first connection channel 164 may form a combined opening. Therefore, there may be no obvious frame of the light-shielding layer 161 between the first opening 163A and the second opening 163B, which may reduce the diffraction of light caused by the frame and improve the imaging clarity of the photosensitive array layer 150. Further, the edges at one side of the first opening 163A may be prevented from being limited by the first color resist unit, thereby avoiding the blurry imaging at the edge of the first opening 163A.

Referring to FIG. 13, along a width direction of the first connection channel 164, a maximum dimension of the first connection channel 164 may be less than a maximum dimension of the first opening 163A, and the maximum dimension of the first connection channel 164 may be less than a maximum dimension of the second opening 163B. Because the width of the first connection channel 164 is less than the first opening 163A and the second opening 163B, the first opening 163A, the first connection channel 164 and the second opening 163B may form a "dumbbell shape" with wide ends and narrow middle.

Figure 15:
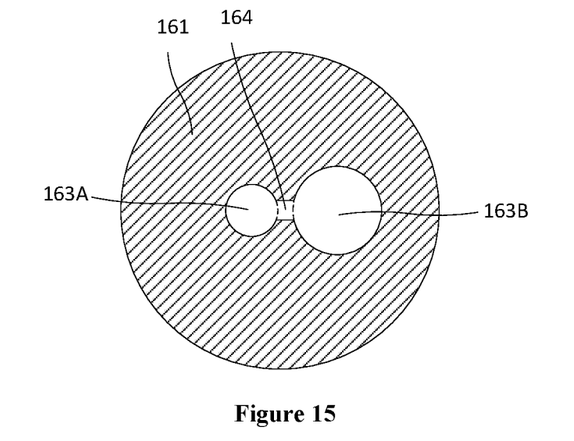
FIG. 15 illustrates a schematic local zoom-in view of a first shielding layer of a region B of another exemplary display panel in FIG. 1 consistent with disclosed embodiments of the present disclosure.

FIG. 15 illustrates a schematic local zoom-in view of a first shielding layer of a region B of another display panel in FIG. 1. One set of the first opening, the second opening, and the first connection channel may be illustrated in FIG. 15. In the present disclosure, multiple sets of the first opening, the second opening, and the first connection channel may be provided.

Referring to FIGS. 10-12, when the first opening 163A is directly connected with the second opening 163B, the first opening 163A and the second opening 163B may have a regular shape to facilitate the connection therebetween. For example, the first opening 163A and the second opening 163B may have a rectangular shape or a hexagonal shape.

Referring to FIG. 15, when the first opening 163A is indirectly connected with the second opening 163B through the first connection channel 164, the first opening 163A and the second opening 163B may have a regular shape or an irregular shape. For example, the first opening 163A and the second opening 163B may have a rectangular shape, a diamond shape, a circular shape, or an elliptical shape. The first opening 163A, the second opening 163B and the first connection channel 164 may form a combined opening. If the shapes of the first opening 163A and the second opening 163B do not facilitate direct connection, the first connection channel 164 may be used to make the first opening 163A be indirectly connected with the second opening 163B. For example, a portion of the edge of at least one of the first opening 163A and the second opening 163B may have a curved segment. Because a portion of the edge has a curved segment, under the premise of not producing obvious sharp points, it may be difficult to directly connect the curved segment of the edge, and, thus, the first connection channel 164 may be used to connect the curved segment of the edge.

Figure 16:
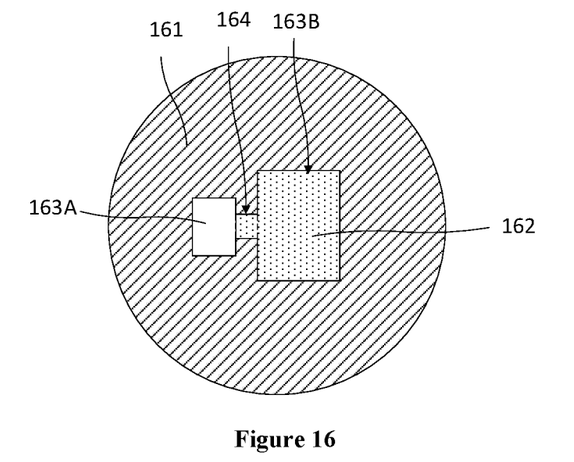
FIG. 16 illustrates a schematic local zoom-in view of a color resist layer of a region B of another exemplary display panel in FIG. 1 consistent with disclosed embodiments of the present disclosure.

FIG. 16 illustrates a schematic local zoom-in view of a color resist layer of a region B of another display panel in FIG. 1. One set of the first opening, the second opening, and the first connection channel may be illustrated in FIG. 16. In the present disclosure, multiple sets of the first opening, the second opening, and the first connection channel may be provided.

Referring to FIG. 16, in addition to covering the second opening 163B, the first color resist unit 162 may also cover the first connection channel 164. After being reflected by the object under test, in addition to passing through the first opening 163A and being irradiated on the photosensitive array layer 150 for imaging, the light may pass through the first connection channel 164 and be irradiated on the photosensitive array layer 150 for imaging. Therefore, through configuring the first color resist unit 162 to cover the first connection channel 164, any other stray light may be prevented from passing through the first connection channel 164 to cause interference on the imaging of the photosensitive array layer 150, which may ensure the clear imaging of the photosensitive array layer 150. The first color resist unit 162 may simultaneously cover the first opening 163A, the second opening 163B, and the first connection channel 164, to further reduce the interference caused by the stray light on the imaging.

Figure 17:
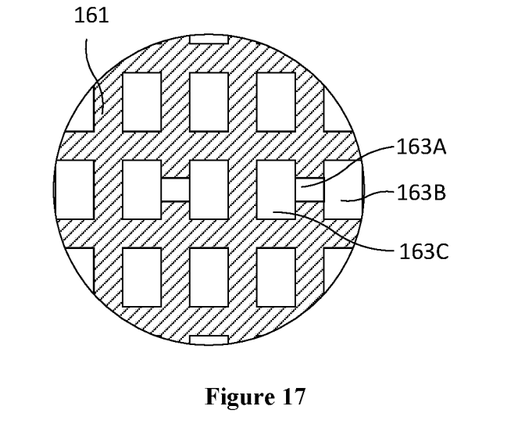
FIG. 17 illustrates a schematic local zoom-in view of a first shielding layer and a second color resist unit of a region B of another exemplary display panel in FIG. 1 consistent with disclosed embodiments of the present disclosure.
Figure 18:
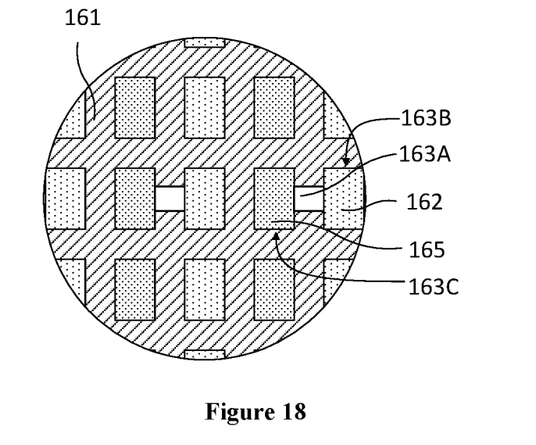
FIG. 18 illustrates a schematic local zoom-in view of a color resist layer and a second color resist unit of a region B of another exemplary display panel in FIG. 1 consistent with disclosed embodiments of the present disclosure.
Figure 19:
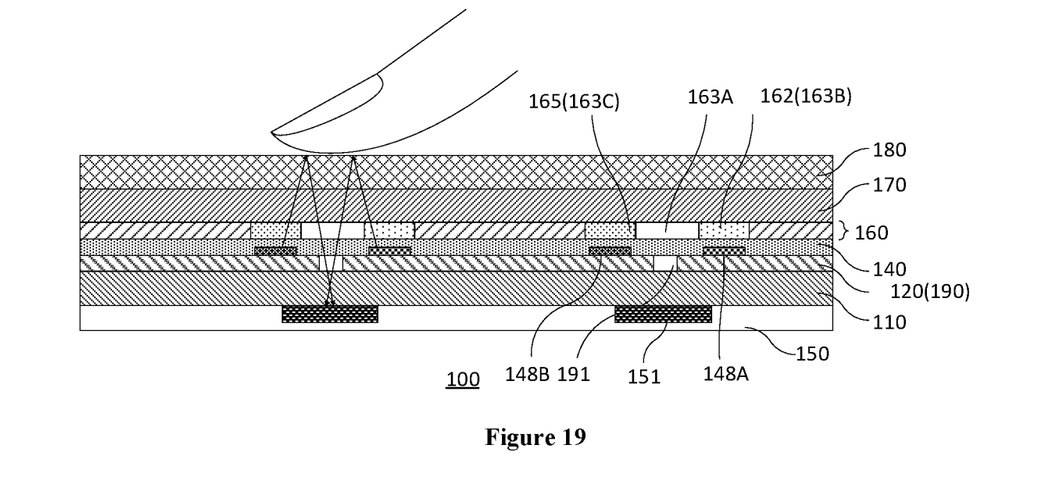
FIG. 19 illustrates a schematic AA-sectional view of another exemplary display panel in FIG. 1 consistent with disclosed embodiments of the present disclosure.

FIG. 17 illustrates a schematic local zoom-in view of a first shielding layer and a second color resist unit of a region B of another display panel in Figure; FIG. 18 illustrates a schematic local zoom-in view of a color resist layer and a second color resist unit of a region B of another display panel in FIG. 1; and FIG. 19 illustrates a schematic AA-sectional view of another display panel in FIG. 1. The specific structures of the light-emitting function layer 140 and the array layer 120 may refer to FIG. 4, and may not be illustrated in FIG. 19.

Referring to FIGS. 17-19, the color resist layer 160 may further include a second color resist unit 165. A color of the color resist of the second color resist unit 165 may be different from the color of the color resist of the first color resist unit 162. The first light-shielding layer 161 may further include a third opening 163C, and the third opening 163C may be connected with the first opening 163A. The second color resist unit 165 may at least cover the third opening 163C. Both the third opening 163C and the second opening 163B may be connected with the first opening 163A, such that the size of the first opening 163A may be determined according to the third opening 163C and the second opening 163B. The light emitted by the light-emitting function layer 140 may pass through the first color resist unit 162 to produce the light corresponding to the color of the first color resist unit 162, and after being reflected by the object under test, the light may pass through the first opening 163A, and then may be imaged on the photosensitive array layer 150. The light emitted by the light-emitting function layer 140 may pass through the second color resist unit 165 to produce the light corresponding to the color of the second color resist unit 165, and after being reflected by the object under test, the light may pass through the first opening 163A, and then may be imaged on the photosensitive array layer 150.

The light of two colors may be imaged on the photosensitive array layer 150. Due to the difference in the positions of the second opening 163B and the third opening 163C, the imaging regions of the light of two colors on the photosensitive array layer 150 may be different, such that the total imaging region corresponding to the light of two colors may have an area greater than the imaging region corresponding to the light of single color, thereby increasing the imaging area of the photosensitive array layer 150. Because both the third opening 163C and the second opening 163B are connected with the first opening 163A, there may be no obvious frame of the first light-shielding layer 161 between the third opening 163C and the first opening 163A and between the second opening 163B and the first opening 163A, and it may be ensured that the light of two colors may be capable of presenting clear images on the photosensitive array layer 150.

Referring to FIG. 18, the first opening 163A, the second opening 163B, and the third opening 163C may be polygonal openings. At least a portion of at least one edge of the first opening 163A may be connected with at least a portion of at least one edge of the second opening 163B, and at least a portion of at least one edge of the first opening 163A may be connected with at least a portion of at least one edge of the third opening 163C, such that both the second opening 163B and the third opening 163C may be directly connected with the first opening 163A. Therefore, the light of two colors may have a substantially small incident angle, to avoid affecting the imaging clarity due to scattering, refraction or total reflection.

Referring to FIG. 19, the light-emitting function layer 140 may include a second light-emitting device 148B. The light may pass through the second color resist unit 165 and may be irradiated on the object under test. After being reflected by the object under test, the light may pass through the first opening 163A, may be irradiated on the photosensitive array layer 150, and may be imaged on the photosensitive array layer 150. To increase the intensity of light passing through the second color resist unit 165, the light-emitting color of the second light-emitting device 148B may be the same as the color of the color resist of the second color resist unit 165, such that more light may pass through the second color resist unit 165 for imaging, and ultimately the brightness of the image may increase.

The second light-emitting device 148B may correspond to the second color resist unit 165. In other words, an orthographic projection of the second light-emitting device 148B on the plane of the display panel 100 may overlap the orthographic projection of the second color resist unit 165 on the plane of the display panel 100. Therefore, the light emitted by the second light-emitting device 148B may pass through the second color resist unit 165 with a substantially small incident angle. After being reflected by the object under test, the light may be smoothly irradiated on the photosensitive array layer 150 for imaging. If the light is scattered, refracted, or totally reflected, the incident angle may be substantially large. The above projection relationship may limit the maximum incident angle allowed by the optical path, which may avoid affecting the clarity and brightness of imaging due to scattering, refraction, or total reflection of the light.

Referring to FIG. 18, both the first color resist unit 162 and the second color resist unit 165 may not cover the first opening 163A. In other words, the first opening 163A may be disposed outside the region covered by the first color resist unit 162, and may be disposed outside the region covered by the second color resist unit 165. The orthographic projection of the first color resist unit 162 on the plane of the display panel 100 may be spaced apart from and may not overlap the orthographic projection of the first opening 163A on the plane of the display panel 100. At the same time, the orthographic projection of the second color resist unit 165 on the plane of the display panel 100 may be spaced apart from and may not overlap the orthographic projection of the first opening 163A on the plane of the display panel 100. Because both the first color resist unit 162 and the second color resist unit 165 may not cover the first opening 163A, the images corresponding to the light of two colors may have a substantially large brightness.

Figure 20:
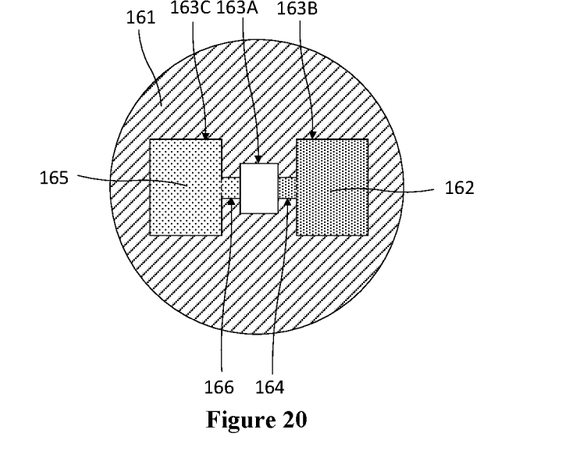
FIG. 20 illustrates a schematic local zoom-in view of a color resist layer of a region B of another exemplary display panel in FIG. 1 consistent with disclosed embodiments of the present disclosure.

FIG. 20 illustrates a schematic local zoom-in view of a color resist layer of a region B of another display panel in FIG. 1 consistent with disclosed embodiments of the present disclosure. One set of the first opening 163A, the second opening 163B, and the third opening 163C may be illustrated in FIG. 20. In the present disclosure, multiple sets of the first opening 163A, the second opening 163B, and the third opening 163C may be provided.

Referring to FIG. 20, when the first opening 163A is indirectly connected with the second opening 163B, the third opening 163C may be indirectly connected with the first opening 163A. In one embodiment, the first opening 163A may be connected with the second opening 163B through at least one first connection channel 164, and the first opening 163A may be connected with the third opening 163C through at least one second connection channel 166. A width direction of the first connection channel 164 may be parallel to a width direction of the second connection channel 166. Along the width direction of the first connection channel 164, a maximum dimension of the first connection channel 164 may be smaller than the maximum dimension of the first opening 163A, and the maximum dimension of the first connection channel 164 may be smaller than the maximum dimension of the second opening 163B. Along the width direction of the second connection channel 166, a maximum dimension of the second connection channel 166 may be smaller than the maximum dimension of the first opening 163A, and the maximum dimension of the second connection channel 166 may be smaller than the maximum dimension of the third opening 163C.

By providing the first connection channel 164 and the second connection channel 166, there may be no obvious frame of the first light-shielding layer 161 between the first opening 163A and the second opening 163B, and between the third opening 163C and the first opening 163A, thereby reducing the diffraction of light caused by the frame, and improving the sharpness of imaging of the photosensitive array layer 150. Further, the edges at one side of the first opening 163A may be prevented from being limited by the first color resist unit 162 or the second color resist unit 165, thereby avoiding unclear imaging corresponding to the edge of the first opening 163A.

Figure 21:
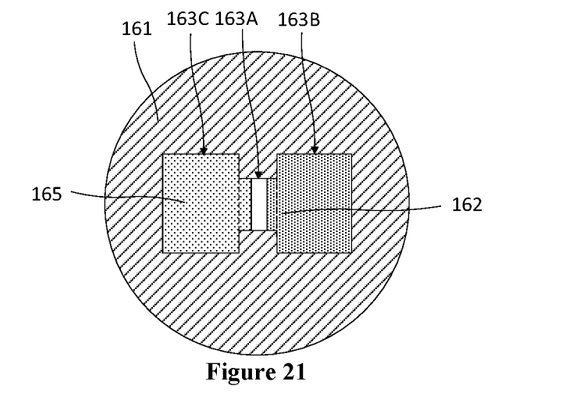
FIG. 21 illustrates a schematic local zoom-in view of a color resist layer of a region B of another exemplary display panel in FIG. 1 consistent with disclosed embodiments of the present disclosure.

FIG. 21 illustrates a schematic local zoom-in view of a color resist layer of a region B of another display panel in FIG. 1. One set of the first opening 163A, the second opening 163B, and the third opening 163C may be illustrated in FIG. 21. In the present disclosure, multiple sets of the first opening 163A, the second opening 163B, and the third opening 163C may be provided.

Referring to FIG. 21, the first color resist unit 162 may cover at least a portion of the first opening 163A, and the second color resist unit 165 may cover a portion of the first opening 163A, such that the stray light may be prevented from passing through the first opening 163A, thereby avoiding interference on imaging of the light of two colors on the photosensitive array layer 150. Considering that the light of two colors may be used to image the object under test, imaging ratios of the images of the light of two colors are almost the same, to facilitate the comparison of the images corresponding to the light of two colors. Therefore, the first color resist unit 162 and the second color resist unit 165 may be spaced apart from each other to prevent the light of the two colors from interfering with each other.

In addition, a region of the first opening 163A covered by the first color resist unit 162 may have a same shape as a region of the first opening 163A covered by the second color resist unit 165, such that the imaging regions of the images corresponding to the light of two colors may have a same shape, to facilitate the comparison of the images corresponding to the light of two colors. Through the above arrangement, the images of the light of two colors on the photosensitive array layer 150 may have almost the same shape and size, while different positions. The object under test may be substantially accurately reflected by the images at different positions.

Figure 22:
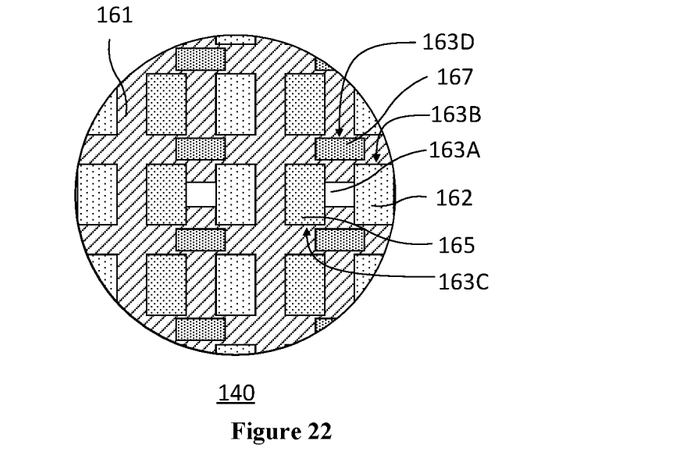
FIG. 22 illustrates a schematic local zoom-in view of a color resist layer of a region B of another exemplary display panel in FIG. 1 consistent with disclosed embodiments of the present disclosure.
Figure 23:
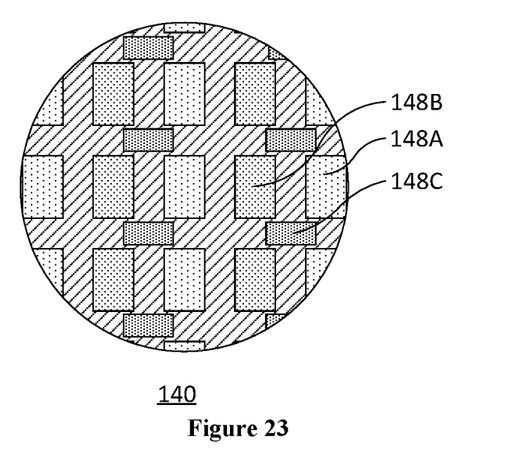
FIG. 23 illustrates a schematic local zoom-in view of a light-emitting function layer of an exemplary display panel corresponding to FIG. 22 consistent with disclosed embodiments of the present disclosure.

FIG. 22 illustrates a schematic local zoom-in view of a color resist layer of a region B of another display panel in FIG. 1; and FIG. 23 illustrates a schematic local zoom-in view of a light-emitting function layer corresponding to FIG. 22.

Referring to FIG. 22 and FIG. 23, the color resist layer 160 may further include a third color resist unit 167, and the first light-shielding layer 161 may further include a fourth opening 163D. The third color resist unit 167 may at least cover the fourth opening 163D. The light-emitting function layer 140 may further include a third light-emitting device 148C. The light-emitting color of the third light-emitting device 148C may be the same as the color of the color resist of the third color resist unit 167. The third light-emitting device 148C may correspond to the third color resist unit 167. In other words, an orthographic projection of the third light-emitting device 148C on the plane of the display panel 100 may overlap an orthographic projection of the third color resist unit 167 on the plane of the display panel 100.

Any two of the first color resist unit 162, the second color resist unit 165, and the third color resist unit 167 may have different color resist colors. Therefore, any two of the light passing through the first color resist unit 162, the light passing through the second color resist unit 165, and the light passing through the third color resist unit 167 may have different colors. When the light passing through the first color resist unit 162 and the light passing through the second color resist unit 165 are imaged, respectively, the light passing through the third color resist unit 167 may not cause interference on imaging.

It should be noted that the colors of the first light-emitting device 148A, the second light-emitting device 148B, and the third light-emitting device 148C may be the red, green, and blue light-emitting colors corresponding to the pixel unit of the display panel 100. In view of this, in the display panel 100, a portion of the first sub-pixels may be multiplexed as the first light-emitting device 148A, a portion of the second sub-pixels may be multiplexed as the second light-emitting device 148B, and a portion of the third sub-pixels may be multiplexed as the third light-emitting device 148C.

Figure 24:
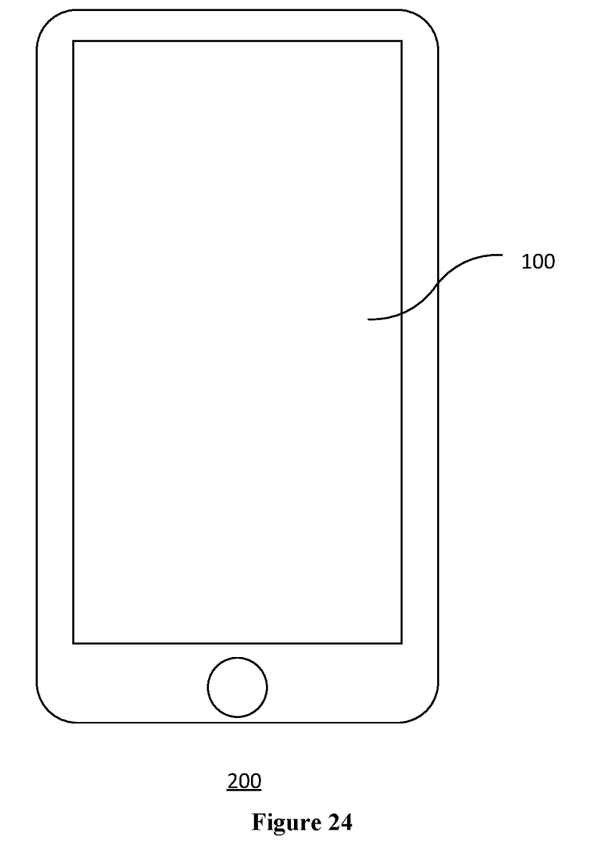
FIG. 24 illustrates a schematic diagram of an exemplary display device consistent with disclosed embodiments of the present disclosure.

The present disclosure also provides a display device. FIG. 24 illustrates a schematic diagram of a display device. Referring to FIG. 24, the display device 200 may include a display panel 100 provided in any of the above disclosed embodiments. The display device 200 may be any product or component having a display functions, such as a mobile phone, a tablet computer, a television, a monitor, a notebook computer, a digital photo frame, a navigator, etc.

Accordingly, the present disclosure provides a display panel and a display device. By connecting the first opening and the second opening, there may be no obvious frame of the first light-shielding layer between the first opening and the second opening, thereby reducing the diffraction of the imaging light, which may not affect the imaging effect of the photosensitive unit and may improve the imaging clarity. At the same time, by connecting the first opening and the second opening, the first opening may be substantially close to the second opening, which may reduce the crosstalk between the light emitted by adjacent light-emitting devices on imaging light, and may further improve the imaging clarity. In addition, when there is no imaging object, the imaging unit of the entire photosensitive array layer may image the light-emitting device, and the operating state of the light-emitting device may be monitored in real time through the imaging content.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
 a photosensitive array layer, including a plurality of photosensitive units arranged in an array;
 a light-emitting function layer; and
 a color resist layer, wherein:
  the light-emitting function layer is disposed between the color resist layer and the photosensitive array layer,
  the color resist layer includes a first light-shielding layer and a plurality of first color resist units,
  the first light-shielding layer contains a plurality of first openings and a plurality of second openings,
  a first opening of the plurality of first openings corresponds to a photosensitive unit of the plurality of photosensitive units, and a first color resist unit of the plurality of first color resist units at least covers a second opening of the plurality of second openings, and
  at least one of the plurality of second openings is connected with the first opening.

2. The display panel according to claim 1, further including:
 a second light-shielding layer, disposed between the photosensitive array layer and the color resist layer, wherein the second light-shielding layer includes a plurality of imaging pinholes, and an imaging pinhole of the plurality of imaging pinholes corresponds to the first opening.

3. The display panel according to claim 2, wherein:
 an orthographic projection of the imaging pinhole on a plane of the display panel has an area less than an orthographic projection of the first opening on the plane of the display panel.

4. The display panel according to claim 1, wherein:
 the first color resist unit covers at least a portion of the first opening.

5. The display panel according to claim 1, wherein:
 the first opening and the second opening forms a combined opening, and
 an angle between extension directions of edges on both sides of any point on an edge of the combined opening is greater than or equal to 90°.

6. The display panel according to claim 1, wherein:
 both the first opening and the second opening are polygonal openings, and
 at least a portion of at least one edge of the first opening is connected with at least a portion of at least one edge of the second opening.

7. The display panel according to claim 1, wherein:
 an orthographic projection of the first opening on the photosensitive array layer is disposed outside an orthographic projection of the second opening on the photosensitive array layer, wherein the first opening is connected with the second opening through at least one first connection channel.

8. The display panel according to claim 7, wherein:
the first color resist unit further covers the at least one first connection channel.

9. The display panel according to claim 7, wherein:
along a width direction of a first connection channel of the at least one first connection channel, a maximum dimension of the first connection channel is less than a maximum dimension of the first opening, and the maximum dimension of the first connection channel is less than a maximum dimension of the second opening.

10. The display panel according to claim 7, wherein:
a portion of an edge of at least one of the first opening and the second opening includes a curved line segment.

11. The display panel according to claim 1, wherein:
the light-emitting function layer includes a plurality of first light-emitting devices, wherein:
a light-emitting color of a first light-emitting device of the plurality of first light-emitting devices is same as a color of color resist of the first color resist unit, and
an orthographic projection of the first light-emitting device on a plane of the display panel overlaps an orthographic projection of the first color resist unit on the plane of the display panel.

12. The display panel according to claim 1, wherein:
the color resist layer further includes a plurality of second color resist units, wherein a color of color resist of a second color resist unit of the plurality of second color resist units is different from a color of color resist of the first color resist unit, and
the first light-shielding layer further includes a plurality of third openings, wherein a third opening of the plurality of third openings is connected with the first opening, and the second color resist unit at least covers the third opening.

13. The display panel according to claim 12, wherein:
the first color resist unit covers at least a portion of the first opening, and the second color resist unit covers another portion of the first opening.

14. The display panel according to claim 13, wherein:
the first color resist unit and the second color resist unit in the first opening are spaced apart from each other.

15. The display panel according to claim 13, wherein:
a region of the first opening covered by the first color resist unit has a same shape as another region of the first opening covered by the second color resist unit.

16. The display panel according to claim 12, wherein:
the first opening is disposed outside a region covered by the first color resist unit, and
the first opening is disposed outside a region covered by the second color resist unit.

17. The display panel according to claim 12, wherein:
the first opening, the second opening, and the third opening are polygonal openings,
at least a portion of at least one edge of the first opening is connected with at least a portion of at least one edge of the second opening, and
at least a portion of at least one edge of the first opening is connected with at least a portion of at least one edge of the third opening.

18. The display panel according to claim 12, wherein:
the light-emitting function layer further includes a plurality of second light-emitting devices, wherein:
a light-emitting color of a second light-emitting device of the plurality of second light-emitting devices is same as the color of the color resist of the second color resist unit, and
the second light-emitting device corresponds to the third opening covered by the second color resist unit.

19. The display panel according to claim 12, wherein:
the color resist layer further includes a plurality of third color resist units, wherein color resist colors of the first color resist unit, the second color resist unit, and a third color resist unit of the plurality of third color resist units are different from each other;
the first light-shielding layer further includes a plurality of fourth openings, wherein the third color resist unit at least covers a fourth opening of the plurality of fourth openings; and
the light-emitting function layer further includes a plurality of third light-emitting devices, wherein:
a light-emitting color of a third light-emitting device of the plurality of third light-emitting devices is the same as a color of color resist of the third color resist unit, and
an orthographic projection of the third light-emitting device on a plane of the display panel overlaps an orthographic projection of the fourth opening covered by the third color resist unit on the plane of the display panel.

20. A display device, comprising:
a display panel, the display panel including:
a photosensitive array layer, including a plurality of photosensitive units arranged in an array;
a light-emitting function layer; and
a color resist layer, wherein:
the light-emitting function layer is disposed between the color resist layer and the photosensitive array layer,
the color resist layer includes a first light-shielding layer and a plurality of first color resist units,
the first light-shielding layer contains a plurality of first openings and a plurality of second openings,
a first opening of the plurality of first openings corresponds to a photosensitive unit of the plurality of photosensitive units, and a first color resist unit of the plurality of first color resist units at least covers a second opening of the plurality of second openings, and
at least part of the plurality of second openings is connected with the first opening.

* * * * *